US006297156B1

(12) United States Patent
Farrar et al.

(10) Patent No.: US 6,297,156 B1
(45) Date of Patent: Oct. 2, 2001

(54) METHOD FOR ENHANCED FILLING OF HIGH ASPECT RATIO DUAL DAMASCENE STRUCTURES

(75) Inventors: Paul A. Farrar, So. Burlington, VT (US); John H. Givens, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/314,657

(22) Filed: May 19, 1999

Related U.S. Application Data

(62) Division of application No. 09/037,935, filed on Mar. 10, 1998, now Pat. No. 5,980,657.

(51) Int. Cl.[7] .................................................. H01L 21/44
(52) U.S. Cl. ..................... 438/687; 438/672; 438/675; 438/688
(58) Field of Search ..................... 438/584, 672, 438/675, 687, 688; 148/438, 502, 505

(56) References Cited

U.S. PATENT DOCUMENTS

| 3,561,954 | 2/1971 | Brook ..................................... 75/142 |
| 4,393,096 | * 7/1983 | Gajda ..................................... 427/90 |
| 4,595,429 | * 6/1986 | Le Caer et al. ........................ 148/403 |
| 5,071,791 | * 12/1991 | Inoue et al. ............................ 437/203 |
| 5,205,770 | 4/1993 | Lowrey et al. ......................... 445/24 |
| 5,229,316 | 7/1993 | Lee et al. . |
| 5,300,155 | 4/1994 | Sandhu et al. ......................... 148/33 |
| 5,354,712 | * 10/1994 | Ho et al. ................................ 437/195 |
| 5,395,801 | 3/1995 | Doan et al. . |
| 5,409,563 | 4/1995 | Cathey ................................... 156/643 |
| 5,416,045 | 5/1995 | Kauffman et al. . |
| 5,497,017 | 3/1996 | Gonzales .............................. 257/306 |
| 5,527,561 | * 6/1996 | Dobson ............................... 427/383.3 |
| 5,641,545 | 6/1997 | Sandhu ................................. 427/573 |
| 5,644,166 | 7/1997 | Honeycutt et al. ................... 257/754 |
| 5,994,221 | * 11/1999 | Kizilyalli et al. ..................... 438/688 |
| 6,017,144 | * 1/2000 | Guo et al. .......................... 364/468.28 |
| 6,090,710 | 7/2000 | Andricacos et al. ................. 438/687 |
| 6,110,829 | * 8/2000 | Besser et al. ......................... 438/688 |

FOREIGN PATENT DOCUMENTS

| 1211563 | 11/1970 | (GB) . |
| 61159545A | 7/1986 | (JP) . |
| 63179041A | 7/1988 | (JP) . |
| 60107654A | 9/1995 | (JP) . |

OTHER PUBLICATIONS

Kaanta, C., et al., "Dual Damascene: A ULSI Wiring Technology", *VMIC Conference*, 144–152, (Jun. 1991).
Licata, T., et al., "Dual Damascene AL Wiring for 256M DRAM", *VMIC Conference*, 596–602, (Jun. 1995).
Zolotorevski, V.S., et al., "Effect of magnesium + Germanium and Magnesium + Silicon Additives on MechanicalProperties and Structure of Cast Aluminum–Copper Alloys", *Izy, Vysah, Uchebn, Zaved, Tsvern, Metall., 5, 100–4*, 100–4, (1983).

* cited by examiner

*Primary Examiner*—Matthew Smith
*Assistant Examiner*—Lex H. Malsawma
(74) *Attorney, Agent, or Firm*—Schwegman, Lundberg, Woessner & Kluth, P.A.

(57) ABSTRACT

An integrated circuit alloy is described which reduces the alloy melting temperature for improved coverage of high aspect ratio features with a reduced deposition pressure. The alloy is used to fabricate metal contacts and interconnects in integrated circuits, such as memory devices. The contacts and interconnects can be high aspect ratio features formed using a dual damascene process. An aluminum interconnect alloy is described for use in an integrated circuit which includes Al, Cu, Si. Ge and Mg can also be provided in the alloy. The composition of Si+Ge+Mg provides a melting temperature of the aluminum interconnect alloy which is between 500 and 550° C.

30 Claims, 2 Drawing Sheets

METHOD FOR ENHANCED FILLING OF HIGH ASPECT RATIO DUAL DAMASCENE STRUCTURES

This application is a divisional of U.S. Ser. No. 09/037,935, filed Mar. 10, 1998 now U.S. Pat. No. 5,980,657.

TECHNICAL FIELD OF THE INVENTION

The present invention relates generally to integrated circuits and in particular, the present invention relates to an alloy for enhanced filling of dual damascene structures.

BACKGROUND OF THE INVENTION

As the density of semiconductor devices continues to increase, the need for smaller interconnections also increases. Historically, the semiconductor industry has used a subtractive etching process to pattern metal interconnect layers of the semiconductor. This metal processing technique, however, has limitations including poor step coverage, non-planarity, shorts and other fabrication problems. To address these problems, a dual damascene technique has been developed. This process, as explained in "Dual Damascene: A ULSI Wiring Technology", Kaanta et al., 1991 VMIC Conference, 144–150 (Jun. 11–12, 1991) and incorporated hereinto reference, involves the deposition of a metal into contact vias and conductor trenches which are patterned in the semiconductor. The semiconductor is then subjected to a known CMP (chemical-mechanical polish) process to both planarize the semiconductor and to remove excess metal from all but the patterned areas.

The metal layer can be fabricated using known CVD (chemical vapor deposition) or PVD (physical vapor deposition) techniques. Filling the patterned structures formed during the dual damascene technique, however, has proved difficult. This difficulty is enhanced as the aspect ratio (depth to width) of the patterns increase. As such, the use of high pressure to achieve improved fill in sub-micron conductor processing for ULSI integrated circuits has received considerable attention recently. One of the problems encountered is that high temperatures must be combined with high pressure to achieve conditions where sufficient metal flow will take place to fill the narrow troughs in the damascene process.

During the metal deposition process, an aluminum alloy which may contain such elements as copper and silicon, is deposited on the integrated circuit wafer. Aluminum has been typically used due to its low resistance and good adhesion to $SiO_2$ and Si. Silicon is usually added as an alloying element to alleviate junction spiking in Al contacts to Si. Further, electromigration and hillocks (spike-like formations) can be reduced by adding Cu, Ti, Pd or Si to aluminum to form alloys. These alloying elements precipitate at the grain boundaries. Thus, the grain boundaries are "plugged" and vacancy migration is inhibited.

For the reasons stated above, and for other reasons stated below which will become apparent to those skilled in the art upon reading and understanding the present specification, there is a need in the art for an alloy which can be used to fill high aspect ration structures in an integrated circuit without requiring high temperatures or pressures. Specifically, an alloy and alloy system is needed which will enable force fill to be achieved at lower temperatures and/or lower pressures than can be obtained with the standard Al-0.5% Cu alloy which is used by much of the industry.

SUMMARY OF THE INVENTION

The above-mentioned problems with metal interconnect alloys in an integrated circuit and other problems are addressed by the present invention, and which will be understood by reading and studying the following specification. A method of forming an interconnect alloy is described which reduces temperature and pressure needed to fabricate high aspect ratio features.

In particular, a method of fabricating an integrated circuit is described. The method comprises the steps of forming contact vias and interconnect trenches in a dielectric layer of the integrated circuit, depositing a metal alloy in the contact vias and interconnect trenches, and polishing the integrated circuit to remove excess metal alloy and provide defined interconnect lines. The alloy comprises aluminum, 4.5 to 5.5 wt percent copper and 1 to 1.5 wt percent silicon.

In one embodiment a method of fabricating high aspect ratio features in an integrated circuit is provided which comprises forming contact vias and interconnect trenches in a dielectric layer of the integrated circuit, depositing a metal alloy in the contact vias and interconnect trenches at force fill temperatures of 300° centigrade, the metal alloy having a resistivity of approximately sixteen percent higher than high purity aluminum, and polishing the integrated circuit to remove excess metal alloy and provide defined interconnect lines.

In another embodiment, a method of fabricating high aspect ratio features in an integrated circuit is provided which comprises forming contact vias and interconnect trenches in a dielectric layer of the integrated circuit, depositing a metal alloy in the contact vias and interconnect trenches at force fill temperatures of 300 centigrade, the alloy having a resistivity of approximately eight percent higher than 0.5 percent copper alloy processed at 400° C., and polishing the integrated circuit to remove excess metal alloy and provide defined interconnect lines.

In another embodiment, a method of fabricating high aspect ratio features in an integrated circuit is provided which comprises forming contact vias and interconnect trenches in a dielectric layer of the integrated circuit, depositing a metal alloy in the contact vias and interconnect trenches at force fill temperatures of 300° centigrade, the alloy comprising an alloying material that does not form volatile fluorides during an etch process, and polishing the integrated circuit to remove excess metal alloy and provide defined interconnect lines.

In yet another embodiment, a method of fabricating high aspect ratio features in an integrated circuit is provided which comprises forming contact vias and interconnect trenches in a dielectric layer of the integrated circuit, depositing a metal alloy in the contact vias and interconnect trenches, the alloy comprising aluminum, 3 to 6 wt percent copper, and 0.25 to 1.5 wt percent silicon, and polishing the integrated circuit to remove excess metal alloy and provide defined interconnect lines.

DETAILED DESCRIPTION OF THE INVENTION

Figure 1A:
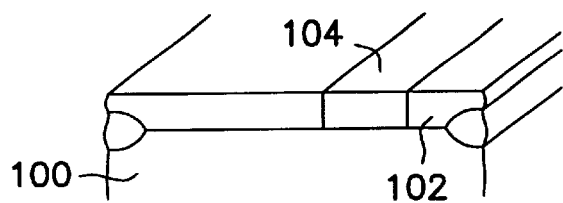
FIGS. 1A–1E are an illustration of a dual damascene fabrication technique according to the present invention.
Figure 1B:
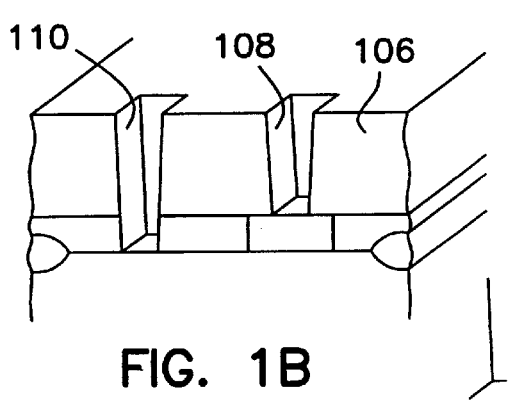
Figure 1D:
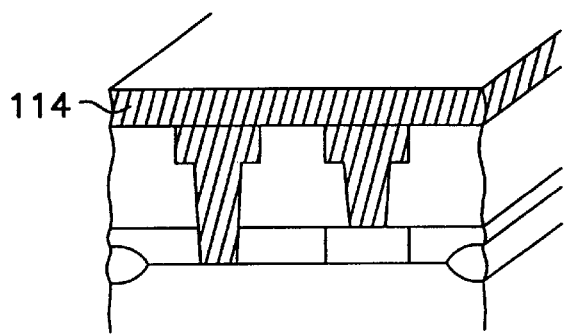
Figure 1C:
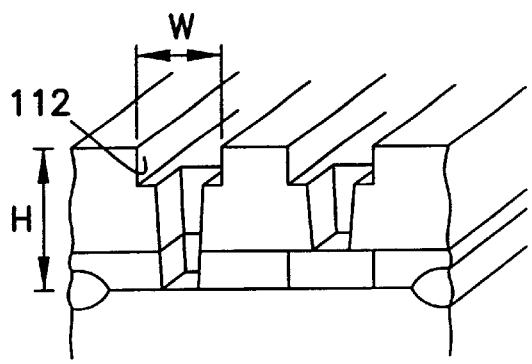
Figure 1E:
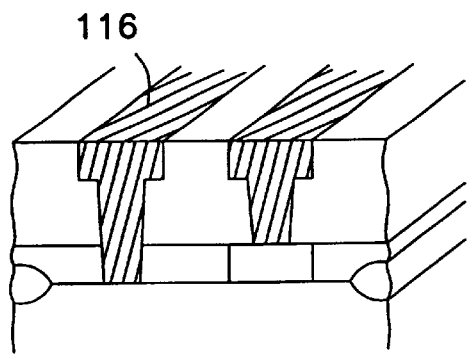

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Prior to describing the metal alloy of the present invention, a description of the fabrication of metal conductor and contacts using a dual damascene process is provided. Referring to FIGS. 1A–E, a semiconductor base layer 100 is fabricated with an insulator layer 102, such as an oxide layer. The base layer is typically silicon having regions which are either p-type or n-type doped. A conductive area 104 is provided above the base layer. This conductive region can be any type of conductor or semiconductor, such as polysilicon, metal or doped silicon. A second layer of insulator material 106 is fabricated on top of the first insulator layer. Using known pattern and etch techniques, a contact via 108, or opening, is formed to access conductor area 104. A contact via 110 is also formed to access base layer 100. The vias may be tapered and are intended to provide access to any region or material which is desired to be coupled to a conductor interconnect.

Conductor interconnect trenches 112 are patterned and etched into the dielectric layer 106. As stated above, the depth to width ration (aspect ratio) of the trenches and vias are typically high. This high aspect ratio created difficulty in properly filling the features with a metal alloy. The composition of the alloys of the present invention is described below, following a description of the remaining steps in the dual damascene process.

After the trenches and access vias are formed, a layer of metal 114 (and necessary barrier metallurgy) is deposited on the device. A physical vapor deposition technique, known to those skilled in the art, is used to fill the features and provide a layer of metal on top of layer 106. A CMP process is implemented to remove excess metal from the top surface of the structure and provide defined interconnect lines 116. As stated above, high temperatures must be combined with high pressure to achieve conditions where sufficient metal flow will take place to fill the narrow troughs 112 and vias 110 in the damascene process when standard Al-0.5% Cu alloy is used. The present invention provides an alloy, alloy system, and method which will enable force fill to be achieved at lower temperatures and/or pressures than can be obtained with the standard Al-0.5% Cu alloy which is used by much of the industry.

To achieve low flow resistance, in the aluminum alloys, it is desirable to operate as near the melting point of the alloy as possible. This can be achieved by either raising the temperature at which the fill takes place or lowering the melting point of the alloy used. Raising the temperature is undesirable because of processing concerns, as well as possible device and structural problems. Developing a lower melting point alloy specifically tailored to integrated circuit use is preferred. The alloy must have a low melting point and must also posses other critical parameters, namely high conductivity and good electromigration resistance. In order to achieve a relatively high conductivity, the elements used to lower the melting point must not have a high solubility in Aluminum at the integrated circuit operating temperature. At least one of the elements used must enhance the electromigration resistance of Aluminum. The elements Cu, Si, Ge and Mg all can lower the melting point of Aluminum, when added in sufficient quantities, and all have rather low solubilities in Aluminum at temperatures below 225° C., as shown in the Table 1.

TABLE 1

| Element added | Max. Solubility* | Solubility at 225° C.* | Solubility at 300° C.* | Solubility at 400° C.* | Eutectic Temp. ° C. |
|---|---|---|---|---|---|
| Cu | 5.65% | 0.06% | 0.19% | 0.64% | 548 |
| Si | 1.65% | 0.05% | 0.1% | 0.28% | 575 |
| Ge | 6.0% | 0.2% | 0.5% | 1.8% | 424 |
| Mg | 14.9% | 4.0% | 6.9% | 12.6% | 450 |
| 2MgSi | | | | 0.55% | 595 |

*percentages given in wt. %

The approximate effect of 1% alloying addition on resistivity in $\mu\Omega$'cm/wt percent alloying element is illustrated in Table 2.

TABLE 2

| Element | In Solid Solution | Not in Solution |
|---|---|---|
| Cu | 0.344 | 0.03 |
| Si | 1.02 | 0.088 |
| Ge | | |
| Mg | 0.54 | 0.22 |

Copper is a well known electromigration enhancing alloying element. Thus, the present invention preferably includes at least 0.5 percent Cu. Further, the preferred alloy composition is an Al—Cu—Si alloy with a silicon concentration of 1 to 1.5 wt percent and a copper concentration of 4.5 to 5.5 wt percent. Useful alloys can be constructed, however, with Ge or Mg substituted for some of the silicon and some what lower copper concentrations. Assuming a composition of 5 wt percent copper and 1.25 wt percent silicon, and deposition and force fill temperatures of 300° C., the alloy resistivity would be approximately 3.06 $\mu\Omega$'cm compared to a value of 2.65 $\mu\Omega$'cm for high purity aluminum at 20° C. This is approximately 16 percent higher than high purity aluminum, but only 8 percent higher than a 0.5 percent copper all by which is currently processed at 400° C.

Current integrated circuit alloys are based on aluminum because of the simplicity of deposition and the low resistance between Al and Si. While it is preferred to use pure aluminum for increased conductivity, some Si and Cu are necessary to alleviate junction spiking and electromigration, respectively. Prior techniques teach that these alloy dopants must be minimized to maintain a high conductivity. Further, current interconnect processes are based on subtractive etch. That is, the metal layer is patterned and etched to remove unwanted metal. The addition of alloy dopants is minimized to improve etching. That is, Cu and Si increase the difficulty of etching because they do not form volatile fluorides. Thus, yield is decreased as the amount of dopants are increased. In contrast, the present invention deviates from the teaching in the art to sacrifice some conductivity to reduce the alloy melting temperature to allow for improved coverage of high aspect ratio features with a reduced pressure.

The present invention provides an alloy system for use in the fabrication of integrated circuits. The alloys of the present invention allow for reduced process temperature and pressures in filling high aspect ratio features using a dual damascene process. The aluminum interconnect alloy, in one embodiment, has 3 to 6 wt percent copper and 0.25 to 1.5 wt percent silicon. Up to 1 wt percent Ge and up to 2 wt percent Mg can also be added. The composition of Si+Ge+Mg is selected give a melting temperature (solidus) of the alloy which is between 500 and 550° C. In another embodiment, the aluminum alloy has 4.5 to 5.5 wt percent copper and 1 to 1.5 wt percent silicon. In a third embodiment, the aluminum alloy has 4.9 wt percent copper and 1.1 wt percent silicon. Again, up to 1 wt percent Ge and up to 2 wt percent Mg can be added to these alloys.

MEMORY DEVICE

Figure 2:
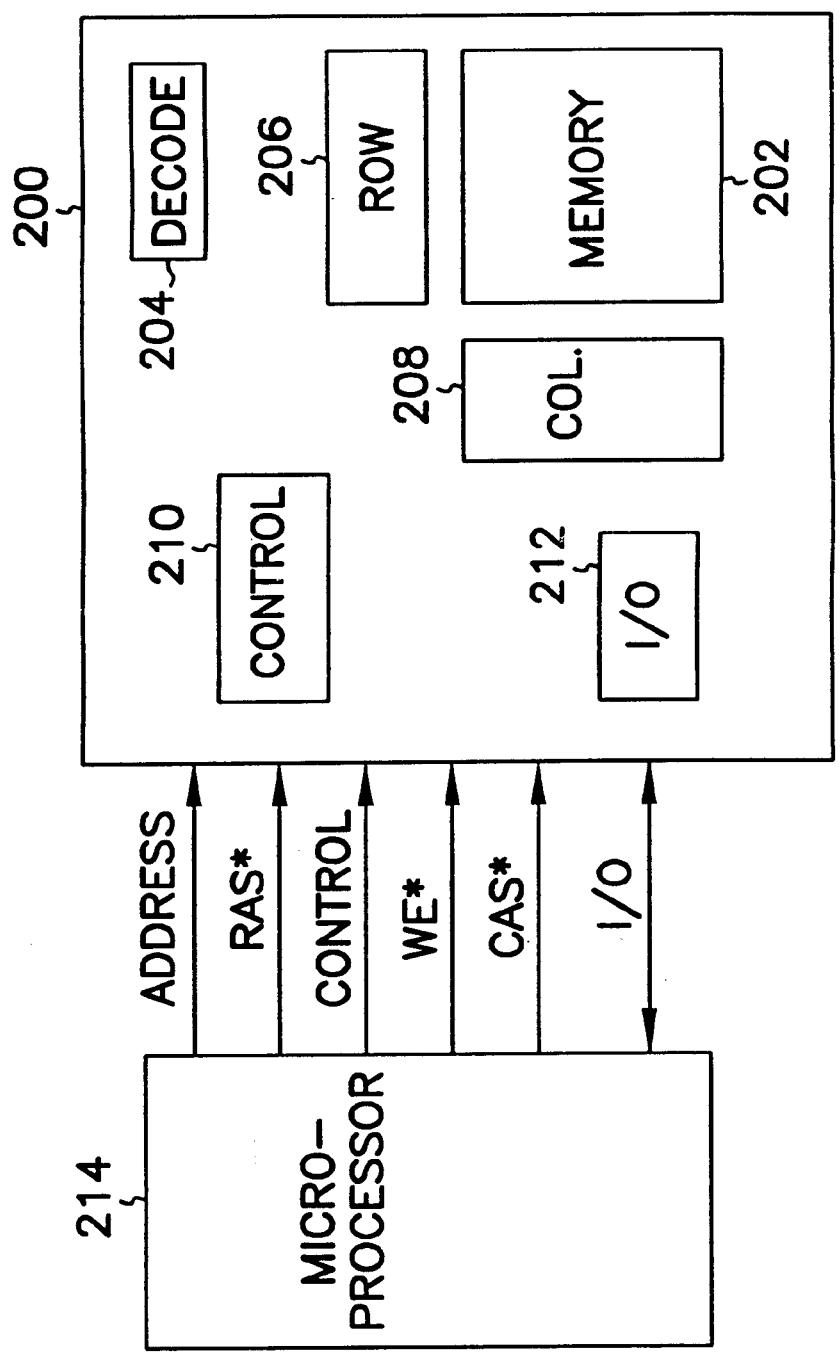
FIG. 2 is a block diagram of an integrated circuit memory device.

FIG. 2 is a simplified block diagram of a memory device according to one embodiment of the present invention. The memory device 200 includes an array of memory cells 202, address decoder 204, row access circuitry 206, column access circuitry 208, control circuitry 210, and Input/Output circuit 212. The memory can be coupled to an external microprocessor 214, or memory controller for memory accessing. The memory receives control signals from the processor 214, such as WE*, RAS* and CAS* signals. The memory is used to store data which is accessed via I/O lines. It will be appreciated by those skilled in the art that additional circuitry and control signals can be provided, and that the memory device of FIG. 10 has been simplified to help focus on the present invention. Thus, the memory includes internal circuitry and metal contacts and interconnects which are coupled to the memory array and internal circuitry. The metal contacts and interconnects are formed with an alloy consisting of aluminum, 3 to 6 wt percent copper, 0.25 to 1.5 wt percent silicon, up to 1 wt percent Ge, and up to 2 wt percent Mg. The composition of Si+Ge+Mg provides a melting temperature (solidus) of the aluminum interconnect alloy which is between 500 and 550° C. In another memory embodiment, the metal contacts and interconnects are formed with an alloy consisting of aluminum, 4.5 to 5.5 wt percent copper, 1 to 1.5 wt percent silicon, up to 1 wt percent Ge, and up to 2 wt percent Mg.

It will be understood that the above description of a DRAM is intended to provide a general understanding of the memory and is not a complete description of all the elements and features of a DRAM. Further, the present invention is equally applicable to any size and type of memory circuit and is not intended to be limited to the DRAM described above. Other alternative types of devices include SRAM or Flash memories. Additionally, the DRAM could be a synchronous DRAM commonly referred to as SGRAM, SDRAM, SDRAM II, and DDR SDRAM, as well as Synchlink or Rambus DRAMs.

Conclusion

An integrated circuit alloy has been described which deviates from the teaching in the art to sacrifice some conductivity of the alloy to reduce the alloy melting temperature. This reduction in melting temperature allows for improved coverage of high aspect ratio features with a reduced deposition pressure. The alloy is used to fabricate metal contacts and interconnects in integrated circuits, such as memory devices. The contacts and interconnects can be high aspect ratio features formed using a dual damascene process.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method of fabricating high aspect ratio features in an integrated circuit, the method comprising the steps of:

forming contact vias and interconnect trenches in a dielectric layer of the integrated circuit;

depositing a metal alloy in a single layer in the contact vias and interconnect trenches, the metal alloy comprises of aluminum, 4.5 to 5.5 wt percent copper and 1 to 1.5 wt percent silicon; and polishing the integrated circuit to remove excess metal alloy and provide defined interconnect lines.

2. The method of claim 1 wherein the copper of the metal alloy is 4.9 wt percent copper.

3. The method of claim 1 wherein the silicon of the metal alloy 1.1 wt percent silicon.

4. The method of claim 1 wherein the copper of the metal alloy is 4.9 wt percent copper, and the silicon is 1.1 wt percent silicon.

5. The method of claim 1 wherein the metal alloy further comprises:

up to 1 wt percent Ge; and up to 2 wt percent Mg, the composition of Si+Ge+Mg provides a melting temperature (solidus) of the aluminum interconnect alloy which is between 500 and 550° C.

6. A method of fabricating high aspect ratio features in an integrated circuit, the method comprising:

forming contact vias and interconnect trenches in a dielectric layer of the integrated circuit;

depositing a metal alloy in a single layer in the contact vias and interconnect trenches, the metal alloy having a resistivity of approximately 3.06 $\mu\Omega$'cm; and polishing the integrated circuit to remove excess metal alloy and provide defined interconnect lines.

7. The method of claim 6, further comprising:

creating a force fill temperature of less than about 300° C., prior to depositing the metal alloy.

8. The method of claim 6, wherein the metal alloy is selected from the group consisting of a metal alloy that is 4.9 wt percent copper, a metal alloy that is 1.1 wt percent silicon, and a metal alloy that is 1.1 wt percent silicon, up to 1 wt percent Ge, and up to 2 wt percent Mg, the composition of Si+Ge+Mg provides a melting temperature (solidus) of the aluminum interconnect alloy which is between 500 and 550 degrees C.

9. A method of fabricating high aspect ratio features in an integrated circuit, the method comprising:

forming contact vias and interconnect trenches in a dielectric layer of the integrated circuit;

depositing a metal alloy in a single layer in the contact vias and interconnect trenches at force fill temperatures of 300° centigrade, the metal alloy having a resistivity of approximately sixteen percent higher than high purity aluminum; and polishing the integrated circuit to remove excess metal alloy and provide defined interconnect lines.

10. The method of claim 9, wherein the metal alloy is an alloy of aluminum and copper.

11. The method of claim 10, wherein the metal alloy includes silicon.

12. The method of claim 9, wherein the metal alloy is selected from the group consisting of a metal alloy that is 4.9 wt percent copper, a metal alloy that is 1.1 wt percent silicon, and a metal alloy that is 1.1 wt percent silicon, up to 1 wt percent Ge, and up to 2 wt percent Mg, the composition of Si+Ge+Mg provides a melting temperature (solidus) of the aluminum interconnect alloy which is between 500 and 550 degrees C.

13. A method of fabricating high aspect ratio features in an integrated circuit, the method comprising:

forming contact vias and interconnect trenches in a dielectric layer of the integrated circuit;

depositing a metal alloy in a single layer in the contact vias and interconnect trenches at force fill temperatures of 300° centigrade, the metal alloy having a resistivity of approximately eight percent higher than 0.5 percent copper alloy processed at 400° C.; and polishing the integrated circuit to remove excess metal alloy and provide defined interconnect lines.

14. The method of claim 13, wherein the metal alloy is an alloy of aluminum and copper.

15. The method of claim 14, wherein the metal alloy includes silicon.

16. The method of claim 13, wherein the metal alloy is selected from the group consisting of a metal alloy that is 4.9 wt percent copper, a metal alloy that is 1.1 wt percent silicon, and a metal alloy that is 1.1 wt percent silicon, up to 1 wt percent Ge, and up to 2 wt percent Mg, the composition of Si+Ge+Mg provides a melting temperature (solidus) of the aluminum interconnect alloy which is between 500 and 550 degrees C.

17. A method of fabricating high aspect ratio features in an integrated circuit, the method comprising:

forming contact vias and interconnect trenches in a dielectric layer of the integrated circuit;

depositing a metal alloy in a single layer in the contact vias and interconnect trenches at force fill temperatures of 300° centigrade, the metal alloy comprising an alloying material that does not form volatile fluorides during an etch process; and polishing the integrated circuit to remove excess metal alloy and provide defined interconnect lines.

18. The method of claim 17, wherein the metal alloy is an alloy of aluminum and copper.

19. The method of claim 18, wherein metal alloy includes silicon.

20. The method of claim 17, wherein the metal alloy is selected from the group consisting of a metal alloy that is 4.9 wt percent copper, a metal alloy that is 1.1 wt percent silicon, and a metal alloy that is 1.1 wt percent silicon, up to 1 wt percent Ge, and up to 2 wt percent Mg, the composition of Si+Ge+Mg provides a melting temperature (solidus) of the aluminum interconnect alloy which is between 500 and 550 degrees C.

21. A method of fabricating high aspect ratio features in an integrated circuit, the method comprising:

forming contact vias and interconnect trenches in a dielectric layer of the integrated circuit;

depositing a metal alloy in a single layer in the contact vias and interconnect trenches, the metal alloy comprises of aluminum, about 4.9 wt percent copper, about 0.25 to about 1.5 wt percent silicon, up to about 1 wt percent Ge, and up to about 2 wt percent Mg, the composition of Si+Ge+Mg provides a melting temperature (solidus) of the metal alloy which is between about 500 and about 550 degrees Centigrade; and polishing the integrated circuit to remove excess metal alloy and provide defined interconnect lines.

22. The method of claim 21, wherein the metal alloy is 4.9 wt percent copper.

23. The method of claim 22, wherein the metal alloy further comprises:

up to 1 wt percent Ge; and up to 2 wt percent Mg, the composition of Si+Ge+Mg provides a melting temperature (solidus) of the aluminum interconnect alloy which is between 500 and 550° C.

24. The method of claim 21, wherein the metal alloy is 1.1 wt percent silicon.

25. The method of claim 24, wherein the metal alloy further comprises:

up to 1 wt percent Ge; and up to 2 wt percent Mg, the composition of Si+Ge+Mg provides a melting temperature (solidus) of the aluminum interconnect alloy which is between 500 and 550° C.

26. The method of claim 21, wherein the metal alloy further comprises:

up to 1 wt percent Ge; and up to 2 wt percent Mg, the composition of Si+Ge+Mg provides a melting temperature (solidus) of the aluminum interconnect alloy which is between 500 and 550° C.

27. A method of fabricating high aspect ratio features in an integrated circuit, the method comprising:

forming contact vias and interconnect trenches in a dielectric layer of the integrated circuit;

depositing a metal alloy in the contact vias and interconnect trenches, the metal alloy comprises of aluminum, about 4.5 to about 5.5 wt percent copper, about 1 to about 1.5 wt percent silicon, up to about 1 wt percent Ge, up to about 2 wt percent Mg, forming a composition of Si+Ge+Mg providing a melting temperature (solidus) of the metal alloy which is between about 500 and about 550° C.; and polishing the integrated circuit to remove excess metal alloy and provide defined interconnect lines.

28. A method of fabricating high aspect ratio features in an integrated circuit, the method comprising:

forming contact vias and interconnect trenches in a dielectric layer of the integrated circuit;

depositing a metal alloy in the contact vias and interconnect trenches, the metal alloy comprises of aluminum, about 4.9 wt percent copper, about 0.25 to about 1.5 wt percent silicon, up to about 1 wt percent Ge, and up to about 2 wt percent Mg, forming a composition of Si+Ge+Mg providing a melting temperature (solidus) of the metal alloy which is between about 500 and about 550 degrees Centigrade; and polishing the integrated circuit to remove excess metal alloy and provide defined interconnect lines.

29. A method of fabricating high aspect ratio features in an integrated circuit, the method comprising:

forming contact vias and interconnect trenches in a dielectric layer of the integrated circuit;

depositing a metal alloy in the contact vias and interconnect trenches, the metal alloy comprises of aluminum, about 4.9 wt percent copper, about 0.25 to about 1.5 wt percent silicon, up to about 1.1 wt percent Ge, and up to about 2 wt percent Mg, forming a composition of Si+Ge+Mg providing a melting temperature (solidus) of the metal alloy which is between about 500 and about 550 degrees Centigrade; and polishing the integrated circuit to remove excess metal alloy and provide defined interconnect lines.

30. A method of fabricating high aspect ratio features in an integrated circuit, the method comprising:

forming contact vias and interconnect trenches in a dielectric layer of the integrated circuit;

depositing a metal alloy in the contact vias and interconnect trenches, the metal alloy comprises of aluminum, about 4.9 wt percent copper, about 0.25 to about 1.1 wt percent silicon, up to about 1 wt percent Ge, and up to about 2 wt percent Mg, forming a composition of Si+Ge+Mg providing a melting temperature (solidus) of the metal alloy which is between about 500 and about 55 degrees Centigrade; and polishing the integrated circuit to remove excess metal alloy and provide defined interconnect lines.

* * * * *

UNITED STATES PATENT AND TRADEMARK OFFICE
CERTIFICATE OF CORRECTION

PATENT NO.    : 6,297,156 B1
DATED         : October 2, 2001
INVENTOR(S)   : Farrar et al.

It is certified that error appears in the above-identified patent and that said Letters Patent is hereby corrected as shown below:

<u>Column 1,</u>
Line 24, delete "hereinto" and insert -- herein by --, therefor.

<u>Column 4,</u>
Line 57, delete "all by" and insert -- alloy --, therefor.

Signed and Sealed this

Ninth Day of April, 2002

JAMES E. ROGAN
*Director of the United States Patent and Trademark Office*

*Attest:*

*Attesting Officer*